US006898745B2

United States Patent
Zanardi et al.

(10) Patent No.: US 6,898,745 B2
(45) Date of Patent: May 24, 2005

(54) INTEGRATED DEVICE WITH OPERATIVITY TESTING

(75) Inventors: Stefano Zanardi, Seriate (IT); Maurizio Branchetti, San Polo D'enza (IT); Jacopo Mulatti, Latisana (IT); Massimiliano Picca, Muggio' (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 718 days.

(21) Appl. No.: 09/798,347

(22) Filed: Mar. 2, 2001

(65) Prior Publication Data

US 2001/0030568 A1 Oct. 18, 2001

(30) Foreign Application Priority Data

Mar. 3, 2000 (IT) ...................................... TO2000A0207

(51) Int. Cl.⁷ .............................................. G01R 31/28
(52) U.S. Cl. ....................... 714/724; 327/433; 327/437; 327/484; 326/31; 326/121
(58) Field of Search ................... 326/31, 121; 327/108, 327/112, 478, 484, 490, 493, 502, 309, 433, 437; 714/724; 365/185.27

(56) References Cited

U.S. PATENT DOCUMENTS

| 5,057,715 A | * 10/1991 | Larsen et al. ................ 326/121 |
| 5,789,951 A | * 8/1998 | Shen et al. .................. 327/110 |
| 6,157,224 A | * 12/2000 | Linder ......................... 327/108 |

* cited by examiner

Primary Examiner—Guy J. Lamarre
(74) Attorney, Agent, or Firm—Lisa K. Jorgenson; E. Russell Tarleton; Seed IP Law Group PLLC

(57) ABSTRACT

An integrated device having a pad receiving, in a standard operative condition, an input signal having a first value and, in a test operative condition, a test voltage having a second value higher than the first value; an input stage connected to the pad and including an electronic component having a first terminal connected to the pad; a third-level detecting stage connected to the pad and supplying a logic third-level signal having a first level in presence of the input signal and a second level in presence of the test voltage; and a selector connected to a second terminal of the electronic component and structured to connect the second terminal to a reference potential in the presence of the first logic level of the third-level signal and to a biasing voltage higher than the reference potential and lower than the second value in the presence of the second logic level of the third-level signal.

13 Claims, 2 Drawing Sheets

INTEGRATED DEVICE WITH OPERATIVITY TESTING

TECHNICAL FIELD

The present invention relates to an integrated device with operativity testing.

BACKGROUND OF THE INVENTION

As is known, some integrated devices are provided with a test structure, which allows a testing operation on particular portions of the integrated device.

To this end, the test structure is provided with a third-level detecting device, which has the function of simplifying switching of the integrated device from a standard operative condition to a test operative condition. In addition, the third-level detecting device has the function of preventing as far as possible accidental activation of the test operative condition when the integrated device is in the standard operative condition.

In general, the test operative condition is activated by taking a specific pin of the integrated device to a higher than a standard voltage value, which is recognized by the integrated device as a high logic level signal.

An integrated device with operativity test, for example a non-volatile memory of a known type, is shown in FIG. 1 and is described hereinafter.

In FIG. 1, a memory 1 comprises an input stage 2 for addressing lines or columns of a memory array (not shown), belonging to the memory 1, and a third-level detecting stage 3. The input stage 2 and the third level detecting stage 3 have respective input terminals 2a, 3a, both connected to a pad 5. The input stage 2 further has an output terminal 2b supplying an address signal ADD<N> for the memory array, whereas the third-level detecting stage 3 has a first and a second output terminal 3b, 3c respectively supplying a third-level signal TL and an inverted third-level signal TL_N.

The input stage 2 comprises a first and a second inverter 6 and 7 of MOS type. The first inverter 6 comprises a pull-up transistor 8 of PMOS type, and a pull-down transistor 9 of NMOS type, which are connected between a supply line 10 set to a voltage Vdd, and a ground line 11. In detail, the pull-up transistor 8 has a source terminal connected to the supply line 10, a drain terminal connected to a first node 12, and a gate terminal connected to the input terminal 2a of the input stage 2. The pull-down transistor 9 has a gate terminal connected to the input terminal 2a of the input stage 2, a source terminal connected to the ground line 11, and a drain terminal connected to the first node 12; the inverter 7 has an input connected to the first node 12, and an output which defines the output terminal 2b of the input stage 2.

The third level detecting stage 3 comprises three PMOS transistors 15 connected as diodes, an NMOS transistor 18 of natural type, and a third, a fourth and a fifth inverter 19, 20 and 21.

The PMOS transistors 15 are connected to one another in series, between the input terminal 3a of the third-level detecting stage 3, and a second, intermediate node 22.

The NMOS transistor 18 has a source terminal connected to the ground line 11, and gate and drain terminals connected to one another and to the second node 22.

The third, fourth and fifth inverters 19, 20 and 21 are cascade connected together between the second node 22 and the second output terminal 3c of the third-level detecting stage 3. The output of the inverter 20 defines the first output terminal 3b of the third-level detecting stage 3.

In the standard operative condition of the memory 1, when the address signal ADD<N> is to be generated, the pad 5 is supplied with an input signal S at a high logic level, the value of which (for example of 3 V) is lower than the voltage necessary for switching on the PMOS transistors 15 and the NMOS transistor 18 (the latter being the sum of the respective threshold voltages). In this condition, any leakage currents flow through the NMOS transistor 18; thus, the second node 22 is grounded; the third-level signal TL is at low logic level, and the signal TL_N is at high logic level.

When testing is to be carried out, a test voltage VTL, of for example 12 V, and higher than the voltage of the high logic level of the input signal S, is applied to the pad 5; the PMOS transistors 15 and the NMOS transistor 18 therefore switch on; consequently, the voltage at the second node 22 exceeds the trip level of the third inverter 19, and the signals TL and TL_N switch respectively to the high and low logic levels.

When the signal TL is at high logic level, the memory 1 switches from the standard operative condition to the test operative condition, and carries out the planned test operations, not described hereinafter since they are not the subject of the present invention.

The integrated devices of the above-described type have the disadvantage that when the memory 1 enters the test operative condition, a high potential difference, higher than in the standard operative condition, is present between the gate terminal and the source terminal of the pull-down transistor 9; consequently, in the test operative condition, the pull-down transistor 9 is subjected to a high stress, which can damage the pull-down transistor 9. This applies in particular in the case of integrated devices designed for operating at a low voltage, where the potential difference existing between the gate and the source terminals of the pull-down transistor 9 can exceed the dielectric rigidity of the gate oxide of the pull-down transistor 9.

SUMMARY OF THE INVENTION

The embodiments of the present invention provide an integrated device with operativity testing, which is free from the described disadvantage.

According to the present invention, an integrated device with operativity test is provided, the integrated device including a pad for receiving an input signal having a first value and a second value greater than the first value, and in a test operative condition a test voltage having a third value higher than the second value; an input stage having an input connected to the pad, the input stage including an electronic component that has a first and a second terminal, the first terminal connected to the input of the input stage and a second terminal connected in standard operative condition to a reference potential line set at a reference potential; a third-level detecting stage connected to the pad and having an output supply and a logic-type third-level signal that has a first level in the presence of the input signal and a second level in the presence of a test voltage; and selector connected to the second terminal of the electronic component and supplying a biasing voltage in the presence of a second level of the third-level signal, the biasing voltage being higher than the reference potential and lower than the third value of the test voltage.

In accordance with another aspect of the invention, a test circuit for an integrated device is provided that includes a first input for receiving an input signal having a first value and a second value greater than the first value, and in a test operative condition a test voltage having a third value higher than the second value; an inverter circuit having a first MOS transistor coupled in series to a second MOS transistor at a first intermediate node, the first input coupled to gate terminals of the first and second MOS transistors; and a switching circuit configured to supply a biasing voltage to a source terminal of a second MOS transistor and to the intermediate node when the input signal is at the test voltage value such that the voltage drop between the gate and the source terminal is lower than the test voltage.

In accordance with another aspect of the foregoing embodiment of the invention, the test circuit further includes a test voltage detector configured to generate a control signal responsive to the presence of a test voltage and wherein the switching circuit is configured to receive as input the control signal from the test voltage detector.

BRIEF DESCRIPTION OF THE DRAWINGS

In order to assist understanding of the invention, an embodiment is now described purely by way of non-limiting example, and with reference to the attached drawings, wherein.

DETAILED DESCRIPTION OF THE INVENTION

Figure 1:
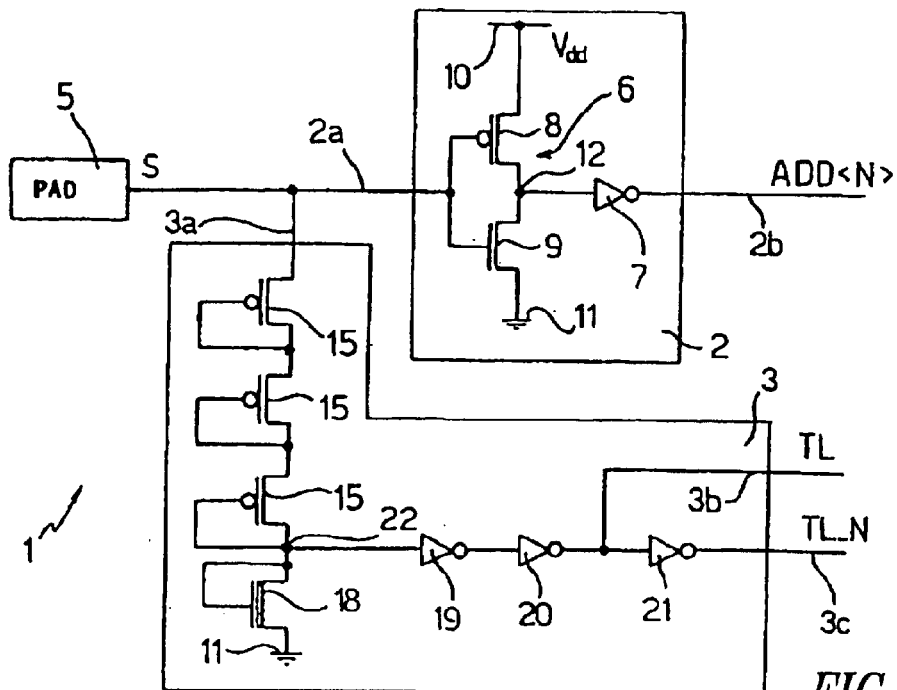
FIG. 1 illustrates a circuit diagram of an integrated device of known type, with operativity test.
Figure 2:
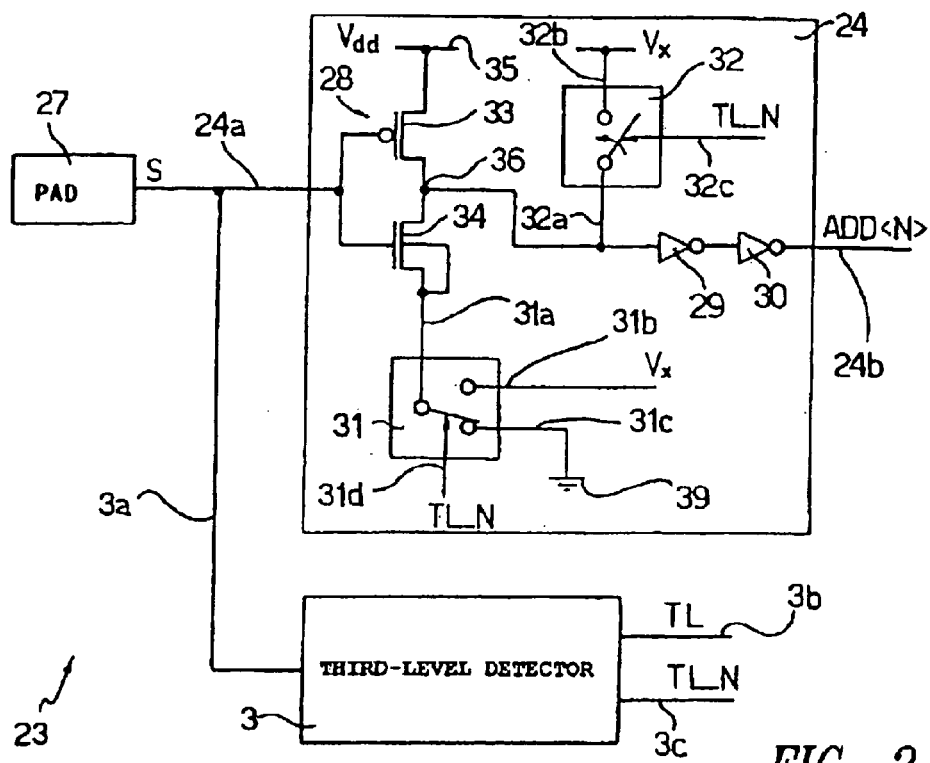
FIG. 2 illustrates a simplified diagram of an integrated device according to the present invention, with operativity test.

In FIG. 2, the integrated device, for example a non-volatile memory, is indicated at 23 as a whole, and comprises an input stage 24 (for example for addressing a line of a memory array, not shown), and a third-level detecting stage 3, similar to the third-level detecting stage 3 described with reference to FIG. 1, and therefore not shown in further detail.

The input stage 24 has an input terminal 24a connected to a pad 27, and an output terminal 24b, supplying an address signal ADD<N>.

The input stage 24 comprises a first, a second and a third inverter 28, 29 and 30, cascade connected, and a first and a second switch element 31 and 32.

The first inverter 28 comprises a pull-up transistor 33 of PMOS type, and a pull-down transistor 34 of NMOS type, which are connected between a supply line 35 set to a voltage Vdd, and an output terminal 31a of the first switch element 31. In detail, the pull-up transistor 33 has a source terminal connected to the supply line 35, a drain terminal connected to an intermediate node 36, and a gate terminal connected to the input terminal 24a of the input stage 24. The pull-down transistor 34 has a gate terminal connected to the input terminal 24a of the input stage 24, a drain terminal connected to the intermediate node 36, a source and bulk terminal, which are connected to one another and to the output terminal 31a of the first switch element 31.

The first switch element 31, which operates as a selector, has a first and a second input terminal 31b, 31c, and a control terminal 31d. The first input terminal 31b of the first switch element 31 is set to a biasing voltage Vx having an appropriate value, as explained hereinafter; the second input terminal 31c of the first switch element 31 is connected to the ground line 39, and the control terminal 31d receives the inverted third-level signal TL_N, supplied to the second output terminal 3c of the third-level detecting stage 3.

The second switch element 32 has an output terminal 32a connected to the intermediate node 36, an input terminal 32b, receiving the biasing voltage Vx, and a control terminal 32c, receiving the inverted third-level signal TL_N.

With reference to FIG. 2, the integrated device 23 operates as follows. During the standard operative condition, when it is necessary to generate the address signal ADD<N>, an input signal S having a high logic level of, for example, 3 V, is supplied to the pad 27. In this condition, as previously explained with reference to FIG. 1, the third-level signal TL is at low logic level, and the inverted third-level signal TL_N is at high logic level. Consequently, the first switch element 31 connects its output terminal 31a, and thus the source terminal of the pull-down transistor 34, to ground; whereas the second switch element 32 keeps the intermediate node 36 disconnected from the biasing voltage Vx, and therefore floating.

When a test voltage VTL (for example of 12 V), with a higher value than the high logic level of the input signal S (for example 3 V) is applied to the contact pad 27, similarly to what previously described with reference to FIG. 1, the third-level signal TL switches to high logic level, and the inverted third-level signal TL_N switches to low logic level. In this condition, the integrated device 1 changes from the standard operative condition to the test operative condition. In particular, the first and the second switch elements 31 and 32 switch, taking the source terminal of the pull-down transistor 34 and the intermediate node 36 to the biasing voltage Vx.

Thereby, the voltage drop between the gate and source terminals of the pull-down transistor 34 is lower than the test voltage VTL supplied to the pad 27, and therefore the stress on the gate oxide region of the pull-down transistor 34 is reduced.

Figure 3:
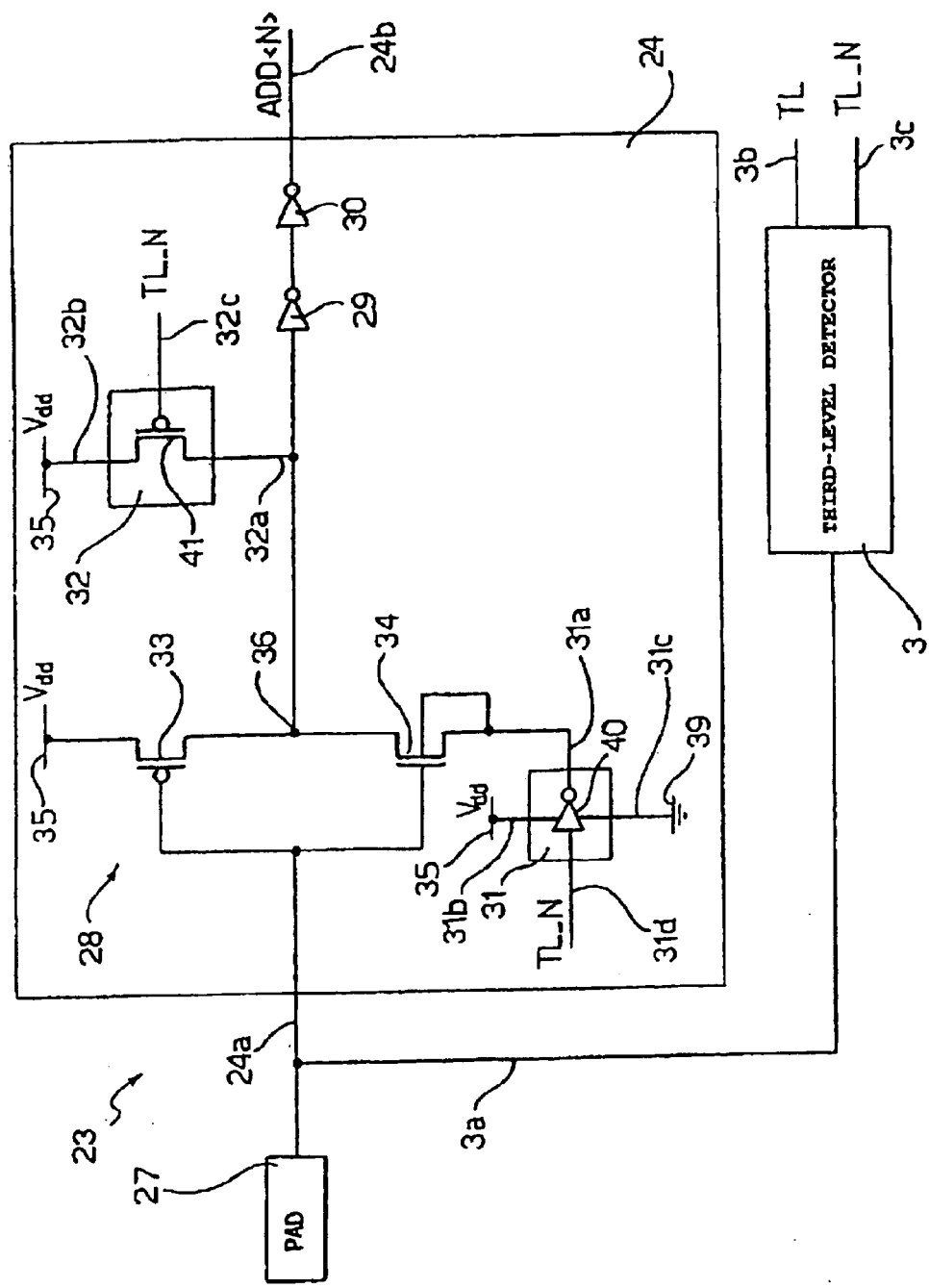
FIG. 3 shows a detailed circuit diagram of the device of FIG. 2.

FIG. 3 shows a detailed diagram of the integrated device 23, wherein the biasing voltage Vx is equal to the supply voltage Vdd.

In particular, the first switch element 31 comprises a selection inverter 40, the input of which (forming the control terminal 31d in FIG. 2) receives the inverted third-level signal TL_N, and the output of which (forming the output terminal 31a) is connected to the source terminal of the pull-down transistor 34. The selection inverter 40 has a supply input (forming the first input terminal 31b of the first switch element 31) connected to the supply line 35, and a reference input (forming the second input terminal 31c of the first switch element 31) connected to the ground line 39.

The second switch element 32 comprises a biasing transistor 41 of PMOS type, which has a source terminal (forming the input terminal 32b in FIG. 2) connected to the supply line 35 set to the voltage Vdd, a drain terminal (forming the output terminal 32a in FIG. 2) connected to the intermediate node 36, and a gate terminal (forming the control terminal 32c in FIG. 2) receiving the inverted third-level signal TL_N from the output 3c of the third-level detecting stage 3.

The integrated device 23 in FIG. 3 operates as follows. When the third-level signal TL is at low logic level, and the inverted third-level signal TL_N is at high logic level (standard operation), the selection inverter 40 takes the source terminal of the pull-down transistor 34 to ground, and enables the first inverter 28. In addition, the biasing transistor 41 is switched off, and does not force any voltage on the intermediate node 36.

When the test voltage VTL is supplied to the pad 27, and the third-level signal TL changes from low to high, and the inverted third-level signal TL_N changes from high to low (testing operation), the inverter 40 takes the source terminal of the pull-down transistor 34 to the supply voltage Vdd. In addition, the transistor 41 switches on, and takes the intermediate node 36 (and the drain terminal which is connected to it) to the supply voltage Vdd.

Consequently, during the test operative condition, the integrated device 23 advantageously reduces the potential difference existing between the gate and the source terminals, which becomes VTL-Vdd. In addition, there is no voltage drop between the drain and source terminals of the pull-down transistor 34. Thereby, the stress in the integrated device is reduced, compared with the known solutions, and the probability of damaging the pull-down transistor 34 is greatly reduced.

In addition, the integrated device 23 is structurally simple and easy to implement, at reduced costs, and with a use of surface area which is comparable to that of the known devices.

Finally, it is apparent that modifications and variants can be made to the integrated device described, without departing from the scope of the present invention. For example, if an intermediate voltage between the supply voltage and the test voltage VTL is available, it is possible to arrange a switch element with a selector function also between the source terminal of the pull-up transistor 33 and the supply line 35, such as to supply this intermediate voltage to the source terminal of the pull-up transistor 33 during the testing.

In addition, the biasing voltage Vx can assume any appropriate value, in particular if the integrated device 23 has additional voltages with a suitable value.

What is claimed is:

1. An integrated device, comprising:
a pad receiving, in a standard operative condition, an input signal having a first value and a second value greater than said first value, and, in a test operative condition a test voltage having a third value, higher than said second value;
an input stage including an inverter and, having an input connected to said pad, said input stage comprising an electronic component which has a first and a second terminal, said first terminal being connected to said input of said input stage and said second terminal being connected, in said standard operative condition, to a reference potential line set at a reference potential;
a third-level detecting stage connected to said pad, and having an output supplying a logic-type third-level signal which has a first level in the presence of said input signal and a second level in the presence of the test voltage; and
biasing means including a switch having a control terminal coupled to the third-level detecting stage, the biasing means connected to said second terminal of the electronic component and supplying a biasing voltage in presence of said second level of said third-level signal, said biasing voltage being higher than said reference potential and lower than said third value of said test voltage.

2. The integrated device of claim 1, wherein said switch comprises:
a first input set to said reference potential, a second input receiving said biasing potential, the control terminal receiving said third-level signal, and an output connected to said second terminal of said electronic component, said output of said switch connected to said first input in the presence of said first level of said third-level signal, and connected to said second input in the presence of said second level of said third-level signal.

3. The integrated device of claim 2, wherein said switch comprises:
an inverter element having a first input connected to said output of said third-level detecting stage and receiving said third-level signal, a supply input receiving said biasing potential, a reference input connected to said reference potential line, and an output connected to said second terminal of said electronic component.

4. The integrated device of claim 1, wherein said switch comprises:
a first input receiving said biasing potential, the control terminal receiving said third-level signal, and an output connected to said second terminal of said electronic component, said switch being open in the presence of said second level of said third-level signal and being closed in the presence of said first level of said third-level signal.

5. The integrated device of claim 4, wherein said switch comprises:
a MOS transistor having a first conduction terminal receiving said biasing potential, a second conduction terminal connected to a third terminal of said electronic component, and a gate terminal receiving said third-level signal.

6. The integrated device of claim 4, wherein said switch comprises:
a PMOS transistor having a source terminal receiving said biasing potential, and a drain terminal connected to said third terminal of said electronic component.

7. The integrated device of claim 1, wherein said electronic component is a MOS transistor.

8. The integrated device of claim 1, wherein said electronic component is an NMOS transistor, and said first terminal is a gate terminal, and said second terminal is a source terminal.

9. The integrated device of claim 1, wherein said biasing potential is a supply voltage.

10. A test circuit for an integrated circuit device, comprising:
a first input for receiving an input signal having a first value and a second value greater than the first value, and, in a test operative condition a test voltage having a third value higher than the second value;
an inverter circuit having a first MOS transistor coupled in series to a second MOS transistor at a first intermediate node, the first input coupled to the gate terminals of the first and second MOS transistors; a test voltage detector configured to generate a control signal responsive to the presence of the test voltage: and
a switching circuit configured to receive as input the control signal from the test voltage detector and to supply a biasing voltage to a source terminal of the second MOS transistor and to the intermediate node when the input signal is at the test voltage value such that the voltage drop between the gate terminal and the source terminal of the second MOS transistor is lower than the test voltage.

11. The test circuit of claim 10, wherein the switching circuit comprises:
a first switch element coupled between the first intermediate node and the biasing voltage; and
a second switch element coupled between the source terminal of the second MOS transistor and having first and second inputs coupled to the biasing voltage and a ground terminal, respectively.

12. The test circuit of claim 11, wherein the first and second switch elements have control inputs each coupled to the test voltage detector to receive the control signal.

13. The test circuit of claim 11, wherein the second switch element is configured to couple the source terminal of the second MOS transistor to the ground reference potential in the absence of the test voltage and to connect the source terminal of the second MOS transistor to the biasing voltage in response to the control signal from the test voltage detector in the presence of the test voltage.

* * * * *